United States Patent [19]

Robinson et al.

[11] E Re. 28,704

[45] Reissued Feb. 3, 1976

[54] SEMICONDUCTOR DEVICES

[75] Inventors: David Phythian Robinson, Meopham; Julian Robert Anthony Beale, Reigate; John Martin Shannon, Whyteleafe; John Anthony Kerr, East Grinstead, all of England; Mukunda Behari Das, University Park, Pa.

[73] Assignee: U.S. Philips Corporation, New York, N.Y.

[22] Filed: Mar. 22, 1974

[21] Appl. No.: 453,876

Related U.S. Patent Documents

Reissue of:

[64] Patent No.: 3,653,978
Issued: Apr. 4, 1972
Appl. No.: 805,275
Filed: Mar. 7, 1969

[30] Foreign Application Priority Data

Mar. 11, 1968 United Kingdom ..... 11845/68

[52] U.S. Cl. ..... 148/1.5; 29/576 R; 357/42; 357/91

[51] Int. Cl.[2] ..... H01L 7/54

[58] Field of Search ..... 148/1.5; 29/576; 357/42, 357/91

[56] References Cited

UNITED STATES PATENTS

| | | | |
|---|---|---|---|
| 3,328,210 | 6/1967 | McCaldin et al. | 148/1.5 |
| 3,388,009 | 6/1968 | King | 148/1.5 |
| 3,413,531 | 11/1968 | Leith | 148/1.5 |
| 3,472,712 | 10/1969 | Bower | 148/1.5 |
| 3,481,030 | 12/1969 | Velde et al. | 148/1.5 |
| 3,515,956 | 6/1970 | Martin et al. | 148/1.5 |

FOREIGN PATENTS OR APPLICATIONS

| | | | |
|---|---|---|---|
| 1,453,565 | 8/1966 | France | 317/235 |
| 1,483,688 | 4/1967 | France | 148/186 |

OTHER PUBLICATIONS

Kellett et al., "High Energy Ion Implantation of Materials," AFCRL-66-367, May 1966, pp. 61-67.

*Primary Examiner*—C. Lovell
*Assistant Examiner*—J. M. Davis
*Attorney, Agent, or Firm*—Frank R. Trifari; Jack Oisher

[57] ABSTRACT

A method for making an IGFET is described. The method utilizes impurity ion implantation into the surface channel to determine the conductivity thereof. The advantages include special impurity profiles providing improved performance, better control over important parameters such as threshold voltage, the manufacture of improved tetrodes, and the manufacture of improved ICs using for example N- and P-channel devices, and depletion and enhancement devices combined in a single chip.

21 Claims, 7 Drawing Figures

INVENTORS
DAVID P. ROBINSON
JULIAN R.A. BEALE
JOHN M. SHANNON
JOHN A. KERR
MUKUNDA B. DAS
BY Frank R. Trifari
AGENT INVENTORS
DAVID P. ROBINSON
JULIAN R. A. BEALE
JOHN M. SHANNON
JOHN A. KERR
MUKUNDA B. DAS
BY Frank R. Trifari
AGENT INVENTORS
DAVID P. ROBINSON
JULIAN R. A. BEALE
JOHN M. SHANNON
JOHN A. KERR
MUKUNDA B. DAS
BY Frank R. Trifari
AGENT

SEMICONDUCTOR DEVICES

Matter enclosed in heavy brackets [ ] appears in the original patent but forms no part of this reissue specification; matter printed in italics indicates the additions made by reissue.

This invention relates to a semiconductor device with a semiconductor body or body part of one conductivity type, comprising at least one insulated gate field effect transistor having first and second spaced low resistivity regions of the opposite conductivity type extending in the body or body part from one surface thereof, a surface region in the body or body part situated adjacent the one surface and between the two low resistivity regions in which charge carriers characteristic of the opposite conductivity type can be caused to flow between said two low resistivity regions within a channel of the opposite conductivity type present or formed in said surface region, a gate electrode at the one surface between the two low resistivity regions and separated from the one surface by insulating material, and electrodes in ohmic contact with the said low resistivity regions and to a method of manufacturing such semiconductor devices.

The low resistivity regions are referred to as the source and drain regions. The insulated gate field effect transistor may form part of a semiconductor integrated circuit and may comprise a plurality of source, drain and gate electrodes.

One commonly known form of such a transistor is the Metal-Oxide-Semiconductor-Transistor, generally referred to as the MOST. In this device generally the semiconductor body or body part is of silicon and the gate electrode is spaced from the silicon surface by an insulating layer of silicon oxide. In operation the applied voltage between the source and drain regions is such that the PN junction between the source and the adjacent 'substrate' part of the semiconductor body is usually, but not always, unbiased and the PN junction between the drain and the adjacent 'substrate' part of the semiconductor body is reverse biased. Current flow between the source and drain regions is controlled in accordance with the voltage applied between the source region and the gate electrode. In the so-called enhancement mode, on application of a voltage of a suitable polarity to the gate electrode a current flow is initiated between the source and drain. In one configuration of the transistor suitable for use in the enhancement mode the voltage applied to the gate causes a surface inversion layer of the opposite conductivity type to be formed in the region of the semiconductor body or body part of the one conductivity type situated adjacent the one surface and between the source and drain. The charge carriers flow in a channel formed by the surface inversion layer. MOST's may also be prepared which operate in the so-called depletion mode. In these devices current can flow between the source and drain with no applied voltage on the gate electrode. The concentration of charge carriers in the channel is decreased by the application of a voltage of suitable polarity to the gate electrode. Such a device may also be operated in the enhancement mode by increasing the concentration of charge carriers in the channel region by the application of a voltage of suitable polarity to the gate electrode. Devices suitable for operation in the depletion mode may be manufactured by forming a diffused surface region of the opposite conductivity type in the region of the semiconductor body or body part adjacent the one surface and between the source and drain. The current carrying channel is thus present in the diffused surface region of the opposite conductivity type.

For devices suitable for operation in the enhancement mode it is necessary to be able to control the threshold voltage, that is the voltage between the gate electrode and the substrate at which current flow between the source and drain is initiated. It is found that the threshold voltage is highly dependent upon the resistivity of the surface region of the semiconductor body or body part between the source and drain, upon the properties of the insulating layer below the gate electrode, upon the properties of the interface between the insulating layer and the semiconductor body or body part, and upon the crystallographic orientation of the semiconductor body or body part.

In devices suitable for operation in the depletion mode in which the current carrying channel is present in a surface inversion layer of the opposite conductivity type, for example silicon MOST's in which an N-type inversion layer is formed at the surface of a high resistivity P-type substrate by oxidation of the surface, the charge carrier mobility is limited due to the current carrying channel being located in the vicinity of the silicon/silicon oxide interface. Depletion type devices having diffused surface channel regions are extremely difficult to fabricate due to the precise doping control required and the precise control of the depth of the diffused region required.

In some semiconductor integrated circuits an insulated gate field effect transistor is formed in a semiconductor body or body part together with other circuit elements, for example a bipolar transistor or another insulated gate field effect transistor having different properties. One such known circuit comprises MOST insulated gate field transistor of both polarities, that is, both P-channel and N-channel devices. These transistors, sometimes referred to as complementary pair MOST's, may be enhancement mode or depletion mode devices depending upon the exact form of the circuit, for example in logic circuits enhancement mode devices are commonly used. Difficulties arise in the manufacture of complementary pair MOST's in a common semiconductor body or body part initially of one conductivity type because it is necessary to obtain precise control of the resistivities of the surface regions of the two MOST's, these surface regions being of different conductivity types. For example, starting with an N-type body in which a P-channel enhancement mode MOST is to be formed, a complementary N-channel enhancement mode MOST has to be formed in a P-type island situated within the N-type body. Diffusion techniques are not always readily suitable for producing the P-type island since the resistivity of the surface region of the diffused P-type island may be too low. One method of overcoming this problem comprises a cavity etch and epitaxial refill method, sometimes referred to as contour deposition. This method, while providing an island of the desired controlled resistivity, is costly and complex since it requires special techniques for locating and re-exposing the initial surface of the body subsequent to the contour epitaxial deposition in the etched cavity and on the surrounding surface.

According to one aspect of the invention, in an insulated gate field effect transistor as herein defined, the surface region within which charge carriers can be caused to flow between the two low resistivity regions in a channel contains a concentration of implanted ions of an impurity element characteristic of the conductivity type of said surface.

Such an insulated gate field effect transistor in which the current carrying channel is located in an ion implanted surface region can have improved properties as will be apparent from the following description of various alternative forms of the transistor.

In one form of the transistor suitable for operation in the depletion mode, said surface region is of the opposite conductivity type and contains a concentration of implanted ions of an impurity element characteristic of the opposite conductivity type. In this transistor, by the provision of the ion implanted surface region of the opposite conductivity type, said region being referred to as a skin, the current flow is within the bulk of the ion implanted skin and is not confined to an area immediately adjacent the semiconductor/insulating layer interface as occurs in the case of a depletion mode device in which the current flow occurs within a preformed inversion layer. The location of the current flow in said bulk yields an increase in the effective carrier mobility in the channel. The carrier mobility in the implanted skin should approach its bulk value and hence the gain factor of the device of a specific geometry is increased. For a specific geometry the magnitude of the increase in gain will be equal to the ratio of bulk to surface mobility values and this may be a factor of from 2 to 3. This configuration is suitable for very high frequency insulated gate field effect devices. In the depletion mode this device operates by the movement of a space charge region through the implanted skin until this skin is completely depleted and the channel is cut off. There is also a space charge region associated with the junction between the skin and the immediately underlying portion of the semiconductor body or body part. By biasing said portion and the gate, the implanted skin can be depleted from both sides. The maximum space charge layer thickness that can be produced by the gate potential is determined by the resistivity of the implanted skin. Hence, accurate control of the thickness of the implanted skin and its resistivity is required. The provision of said skin by the method of ion implantation has been found to yield said control. Furthermore significant improvements can be obtained using the method of ion implantation to form the skin as compared with the method of producing the skin by diffusion techniques. It will be appreciated that it is difficult to control precisely the resistivity of a skin when using such diffusion techniques, particularly to obtain a skin of relatively high resistivity. Also the method of ion implantation can yield an impurity concentration profile, in the direction extending from the surface through the skin, which is more readily suitable for the formation of a current carrying channel.

In the said transistor suitable for operation in the depletion mode, the first and second low resistivity regions of the opposite conductivity type at least in the vicinity of their closest separation may each comprise a portion containing a concentration of implanted ions of an impurity element characteristic of the opposite conductivity type, the dimension of the gate electrode in the lateral direction between said first and second low resistivity regions corresponding substantially to the lateral separation of said first and second low resistivity regions. This configuration of the transistor may be obtained by a method as described in a copending application Ser. No. 753,449, filed Aug. 19, 1968 in which initially portions of the source and drain regions are formed by diffusion techniques, the source, drain and gate electrodes are then provided, and thereafter an ion implantation process is carried out, preferably through an insulating layer present on the one surface, to extend the source and drain regions towards each other. In this method a metal layer constituting the gate electrode acts as a mask and the channel formed in the resultant surface region between the source and drain regions has a length corresponding substantially to the lateral dimensions of the gate electrode. With such a method insulated gate field effect transistors can be fabricated having precisely controlled channel lengths of small dimensions and having a very small gate/drain capacitance since the gate/drain overlap is only governed by the sideways scattering and channelling of implanted ions. This method will be referred to hereinafter as Auto-Registration.

In the depletion mode transistor according to the invention in which the first and second low resistivity regions of the opposite conductivity type (source and drain) each comprise an ion implanted portion, said ion implanted portions and the ion implanted surface region of the opposite conductivity type may be present in and partly surrounded by an ion implanted region of the one conductivity type, said ion implanted region of the one conductivity type having a lower resistivity than the adjacent underlying semiconductor body part of the one conductivity type. This configuration provides a depletion device having a high carrier mobility in the channel and a high gain factor. The presence of the lower resistivity ion implanted region of the one conductivity type serves to reduce the spreading of the depletion layer associated with the junction between the drain and the adjacent part of the one conductivity type and thus inhibits punch-through to the source. Consequently a small source to drain separation is possible. The provision of the ion implanted portions of the source and drain regions using the method of Auto-Registration yields a device having a low gate to drain feedback capacitance and renders possible the small separation between the source and drain. In this device the first and second low resistivity regions of the opposite conductivity type (source and drain), the ion implanted surface region of the opposite conductivity type, in which the channel is present, the ion implanted region of the one conductivity type, and the underlying semiconductor body part of the one conductivity type all may be present in a high resistivity layer mainly of the one conductivity type situated on a low resistivity substrate of the one conductivity type. This configuration provides a depletion device having a low drain to substrate capacitance since at fairly high applied voltages between the drain and substrate the depletion layer associated with the PN junction between the drain and the underlying high resistivity layer part of the one conductivity type approaches the low resistivity substrate.

In another form of an insulated gate field effect transistor according to the invention, which is suitable for operation in the enhancement mode, said surface region is of the one conductivity type and contains a concentration of implanted ions of an impurity element characteristics of the one conductivity type, the resistivity of the ion implanted surface region being lower than the resistivity of an immediately underlying portion of the semiconductor body or body part of the one conductivity type. The provision of the ion implanted lower resistivity surface region, which may be referred to as a lower resistivity skin, enables insulated gate field effect transistors suitable for operation in the enhancement mode to be obtained, said transistors having accurately controlled threshold voltages. The process of ion implantation for forming the skin has certain advantages compared with diffusion techniques in that it can yield impurity concentration profiles in the skin which are better suited to the requirement of forming a channel therein by inversion.

In the said transistor according to the invention suitable for operation in the enhancement mode, the first and second low resistivity regions of the opposite conductivity type at least in the vicinity of their closest separation may each comprise a portion containing a concentration of implanted ions of an impurity element characteristic of the opposite conductivity type, the dimension of the gate electrode in the lateral direction between said first and second low resistivity regions corresponding substantially to the lateral separation of the first and second low resistivity regions. In this device, in which the technique of Auto-Registration is used, similar advantages arise in respect of the low gate/drain capacitance and small dimension of the channel as have been previously described with reference to the depletion mode insulated gate field effect transistor. Each of the first and second low resistivity regions of the opposite conductivity type (source and drain) may comprise a portion containing a concentration of a diffused impurity element characteristic of the opposite conductivity type and an adjoining portion containing a concentration of implanted ions of an element characteristic of the opposite conductivity type, the said ion implanted portions lying within and partly surrounded by the ion implanted surface region of the one conductivity type. This configuration provides an enhancement device having a precisely controlled threshold voltage and a high gain factor. The ion implanted surface region of the one conductivity type partly surrounding the ion implanted portions of the source and drain and the channel also serves to reduce the spreading of the depletion layer associated with the junction between the drain and the adjacent part of the one conductivity type and thus inhibits punch-through to the source. This permits the use of a small separation between the source and drain, said small separation being achieved, for example using the technique of Auto-Registration.

In the said transistor suitable for operation in the enhancement mode the first and second low resistivity regions of the opposite conductivity type (source and drain) and the ion implanted surface region of the one conductivity type may be present in a layer consisting mainly of the one conductivity type situated on a lower resistivity substrate of the one conductivity type. This structure is particularly suitable for enhancement mode devices suitable for high frequency operation because at fairly high voltages, for example 20 volts between the drain and the substrate, the depletion layer associated with the junction between the drain and the underlying region in the layer of the one conductivity type approaches the lower resistivity substrate and thus the capacitance between the drain and the substrate is small.

In another form of an insulated gate field effect transistor according to the invention, a third low resistivity region of the opposite conductivity type extends in the body or body part from the one surface and is situated between the two spaced low resistivity regions of the opposite conductivity type, first and second surface regions being present within which first and second current carrying channels respectively are formed, at least the first surface region being of the opposite conductivity type and containing a concentration of implanted ions of an impurity element characteristic of the opposite conductivity type, first and second gate electrodes being present, the first gate electrode being associated with the first surface region and the first current carrying channel formed therein between the first and third low resistivity regions of the opposite conductivity type, and the second gate electrode being associated with the second surface region and the second current carrying channel formed therein between the third and second low resistivity regions of the opposite conductivity type. Such a transistor may be referred to as a tetrode insulated gate field effect transistor.

Tetrode MOST's are described in British Pat. Specification No. 1,037,850 and are designed to be capable of giving useful power gain at high frequencies, for example at least 10dB at 900 Mc/s. The tetrode MOST constitutes an improvement on a single gate, triode MOSE in respect of the serious limitation that is imposed on the power gain at high frequencies by the gate to drain feedback capacitance which occurs in a triode MOST. The tetrode MOST may be considered as the cascade arrangement of two MOST's, the third low resistivity region of the opposite conductivity type forming the drain of the first MOST and the source of the second MOST. Said third region is hereinafter referred to as the virtual source and drain as it has no electrode. In actual circuit operation the second gate electrode is usually kept short circuited to the source of the first transistor and to the substrate, thus providing the shielding between the drain of the second transistor and the gate of the first transistor. The effective feedback capacitance between the drain and the first gate is equal to the feedback capacitance between the first gate and the intermediate virtual source and drain divided by the voltage amplification of the second transistor. The maximum stable power gain in the cascade arrangement is therefore increased by a factor equal to the voltage amplification of the second transistor, particularly at low and moderate frequencies. The overall high frequency limitations are dependent, inter alia, upon the magnitudes of the capacitances between the virtual source and drain and the substrate, and between the drain of the second transistor and the substrate, and between the gate of the first transistor and the drain of the second transistor.

In a tetrode insulated gate field effect transistor according to the invention, the provision of the first surface region of the opposite conductivity type containing a concentration of implanted ions of an impurity element characteristic of the opposite conductivity type, said first surface region being referred to hereinafter as an ion implanted skin, yields a first transistor part suitable for operation in the depletion mode and having an ion implanted skin. Furthermore the process of ion implantation to form said skin allows a substrate of a desired resistivity to be used. In this device the second transistor part may either operate in the enhancement mode or in the depletion mode. When it operates in the depletion mode the second surface region may be of the opposite conductivity type also containing a concentration of implanted ions of an impurity element characteristic of the opposite conductivity type. Such an ion implanted skin may be formed simultaneously with the ion implanted skin which constitutes the first surface region. Alternatively if the second transistor part is to operate in the enhancement mode no such ion implanted skin need be provided. It will be appreciated that for the first transistor part it is desirable to keep the channel length as small as possible and for this purpose the technique of Auto-Registration may be employed.

The first and third low resistivity regions of the opposite conductivity type at least in the vicinity of their closest separation may each comprise a concentration of implanted ions of an impurity element characteristic of the opposite conductivity type, the lateral dimension of the first gate electrode which is associated with the first surface region corresponding substantially to the lateral separation of the first and third low resistivity regions. Similarly, if desired, the technique of Auto-Registration may be employed in determining the channel length in the second surface region. In one form the second and third low resistivity regions of the opposite conductivity type at least in the vicinity of their closest separation each comprise a concentration of implanted ions of an impurity element characteristic of the opposite conductivity type, the lateral dimensions of the second gate electrode which is associated with the second surface region corresponding substantially to the lateral dimension of the second current carrying channel formed in said second surface region. In this form of the device the technique of Auto-Registration is used to determine the lateral dimension of the second surface region on both sides of said region, that is both at the second and third low resistivity regions. In another form the technique of Auto-Registration is used to determine the lateral dimension of the second surface region as far as said dimension is determined by the position of the third low resistivity region of the opposite conductivity type. Thus the third low resistivity region of the opposite conductivity type at least in the vicinity of its closest separation from the second low resistivity region may comprise a concentration of implanted ions of an impurity element characteristic of the opposite conductivity type, the lateral boundary of the second gate electrode in the vicinity of the third low resistivity region corresponding to the lateral boundary of said third low resistivity region.

In the tetrode insulated gate field effect transistor each of the first and second low resistivity regions may comprise a portion containing a concentration of a diffused impurity element characteristic of the opposite conductivity type and, if the technique of Auto-Registration is used to define the first and second surface regions, the first and second low resistivity regions may each comprise a portion containing a concentration of implanted ions of an impurity element characteristic of the opposite conductivity type. The third low resistivity region of the opposite conductivity type may consist of a diffused region and when the technique of Auto-Registration is used it may additionally comprise a portion containing a concentration of implanted ions of an impurity element characteristic of the opposite conductivity type. Alternatively the third low resistivity region may be determined entirely by a concentration of implanted ions of an element characteristic of the opposite conductivity type and not contain a diffused concentration of said element.

In a tetrode insulated gate field effect transistor according to the invention, in the semiconductor body or body part of the one conductivity type adjacent the third low resistivity region of the opposite conductivity type and on the side of said third region which faces the second low resistivity region of the opposite conductivity type there may be present a local low resistivity region of the one conductivity type containing a concentration of implanted ions of an impurity element characteristic of the one conductivity type. The presence of the low resistivity ion implanted region of the one conductivity type serves to reduce the spreading of the depletion layer associated with the junction between the second region and the substrate and thus inhibit punch-through to the third low resistivity region (virtual source and drain). Thus it is impossible to have a small separation between the drain and the virtual source and drain without punch-through occurring at normal applied voltages. Said local low resistivity ion implanted regions of the one conductivity type may comprise ions introduced in the body or body part through open channels in the crystal lattice. Such a method of ion implantation is referred to as channelling.

In a further form of an insulated gate field effect transistor according to the invention, the concentration of implanted ions of the impurity element characteristic of the conductivity type of said surface region is different in different parts of said surface region between the first and second low resistivity regions of the opposite conductivity type. Various different configurations of such a transistor are possible, for example the concentration variation of implanted ions may provide a device having a variable $\mu$ characteristic. Such a device is described in British Pat. No. 1,075,085. In another form the concentration variation may be such that in the lateral direction of the surface region between the first and second low resistivity regions of the opposite conductivity type (source and drain) the concentration of implanted ions increase from the one of said regions which forms the drain region towards the other of said regions which forms the source region. A similar device in which the impurity concentration variation is obtained by diffusion is described in a copending application, Ser. No. 688,227, filed Dec. 5, 1967.

In an insulated gate field effect transistor according to the invention the semiconductor body or body part may be of silicon, and the insulating material may be of silicon oxide or silicon nitride. These devices are referred as MOST's and MNST's respectively. In one form of the transistor in which the semiconductor or body part is of silicon the insulating material may comprise a first layer portion of silicon oxide on the surface of the semiconductor body or body part above the said ion implanted surface region and a second layer portion of silicon nitride on the silicon oxide layer, the gate electrode being situated on the silicon nitride layer portion. Such a device may be referred to as a MNOST.

The insulating material may contain a concentration of implanted ions of an element which stabilizes said layer. An insulated gate field effect transistor of silicon comprising a silicon oxide insulating layer or layer portion may contain a concentration of implanted phosphorus ions which stabilize said layer or layer portion. It is well known that phosphorus will reduce considerably surface charge and movement of charge in silicon dioxide. This stabilization is most effective when the phosphorus is introduced just below the surface of the silicon oxide layer since if the layer is contaminated with sodium ions their concentration is maximum at this position. By controlling the energy, ion implantation of phosphorus ions into the silicon oxide layer yields an effective method for obtaining the desired phosphorus profile in a silicon oxide layer or layer portion.

According to another aspect of the invention, in a method of manufacturing an insulated gate field effect transistor ions, of an impurity element are implanted in a region of a semiconductor body or body part of one conductivity type adjoining one surface thereof to determine the conductivity and conductivity type of the surface region within which a current carrying channel is formed between two low resistivity regions of the opposite conductivity type extending into the body or body part from said one surface.

In one form of the method the implanted ions are characteristic of the opposite conductivity type and form a surface region of the opposite conductivity type. This form of the method may be employed for the manufacture of an insulated gate field effect transistor suitable for operation in the depletion mode.

In another form of the method the implanted ions are characteristic of the one conductivity type and form a surface region of the one conductivity type having a lower resistivity than the immediately underlying portion of the semiconductor body or body part of the one conductivity type. This form of the method may be suitably employed for the manufacture of an insulated gate field effect transistor suitable for use in the enhancement mode.

In a method according to the invention at least parts of the two low resistivity regions of the opposite conductivity type may be formed by diffusion of an impurity element characteristic of the opposite conductivity type into portions of the one surface, the implantation of ions into the surface region within which the current carrying channel is formed being carried out subsequent to said diffusion. The implantation is carried out subsequent to the diffusion to avoid excessive diffusion of the implanted layer or layers.

According to a further aspect of the invention a semiconductor device comprises a semiconductor body or body part of one conductivity type, an ion implanted region of the opposite conductivity type extending in the body or body part from one surface thereof and containing a concentration of implanted ions of an impurity element characteristic of the opposite conductivity type, an insulated gate field effect transistor formed in the ion implanted region of the opposite conductivity type and at least one other circuit element formed in the material of the body or body part of the one conductivity type. Such a semiconductor device may consist of a semiconductor integrated circuit comprising the said insulated gate field effect transistor formed in the ion implanted region of the opposite conductivity type and at least one other circuit element, for example a bipolar transistor or an insulated gate field effect transistor formed in the material of the body or body part of the one conductivity type. The ion implanted region of the opposite conductivity type may be considered as an island in the body or body part of the one conductivity type. Certain advantages arise in forming said island by the technique of ion implantation compared with the known techniques of diffusion and contour epitaxial deposition. It is found that the method of ion implantation can yield an island of desired resistivity to form an insulated gate field effect transistor therein, the characteristic of said transistor being compatible with the characteristics of another insulated gate field effect transistor formed in the material of the body or body part of the one conductivity type.

Thus in one preferred form of the semiconductor device, said other circuit element is an insulated gate field effect transistor having different properties to the insulated gate field effect transistor formed in the ion implanted region of the opposite conductivity type. Said two insulated gate field effect transistors may be complementary in the sense that their surface regions within which the current channels are formed are of different conductivity types. Thus for example the device may comprise a P-channel MOST and a complementary N-channel MOST located in a common semiconductor body.

The two insulated gate field effect transistors may both be suitable for operation in the enhancement mode or may both be suitable for operation in the depletion mode. Alternatively one insulated gate field effect transistor may be suitable for operation in the enhancement mode and the other insulated gate field effect transistor suitable for operation in the depletion mode.

In at least one of the two insulated gate field effect transistors the surface region may be of different conductivity or conductivity type to the immediately underlying portion of the semiconductor body part and contains a concentration of implanted ions which determines said different conductivity or conductivity type. Thus said one transistor may comprise an ion implanted skin as previously described and this transistor may be constructed in a similar manner to the previously described transistors comprising such skins.

In a semiconductor device according to the invention in one or more insulated gate field effect transistors present in the semiconductor body or body part, the first and second low resistivity regions at least in the vicinity of their closest separation may each comprise a concentration of implanted ions of an impurity element characteristic of the conductivity type of said regions, the lateral dimension of the gate electrode associated with the surface region between said regions corresponding substantially to the lateral separation of the first and second low resistivity regions. This device employs the manufacturing technique of Auto-Registration as previously described and corresponding advantages arise in its utilization as have been described with reference to the insulated gate field effect transistors having surface skins.

In a semiconductor device according to the invention the ion implanted region of the opposite conductivity type within which an insulated gate field effect transistor is formed may comprise ions introduced in the body part through open channels in the crystal lattice. Channelling is a suitable method for forming an island of the opposite conductivity type extending deeply into the body part from the one surface and having the desired resistivity for forming the insulated gated field effect transistor therein.

According to another aspect of the invention a method of manufacturing a semiconductor device comprises the steps of implanting in a region of a semiconductor body or body part of one conductivity type a concentration of ions of an impurity element characteristic of the opposite conductivity type, said implanted ion concentration determining a region of the opposite conductivity type which extends to one surface of the body or body part and is surrounded within the body or body part by a region of the one conductivity type, forming an insulated gate field effect transistor in the implanted region of the opposite conductivity type and at least one other circuit element in the region of the one conductivity type.

According to a further aspect of the invention a method of manufacturing a semiconductor device comprising at least two insulated gate field effect transistors having different properties, comprises the steps of implanting in a region of a semiconductor body or body part of one conductivity type a concentration of ions of an impurity element characteristic of the opposite conductivity type, said implanted ions concentration determining a region of the opposite conductivity type which extends to one surface of the body or body part and is surrounded within the body or body part by a region of the one conductivity type, forming in the region of the one conductivity type spaced, low resistivity regions of the opposite conductivity type constituting source and drain regions of a first insulated gate field effect transistor, forming in the ion implanted region of the opposite conductivity type spaced, low resistivity regions of the one conductivity type constituting source and drain regions of a second insulated gate field effect transistor, providing an insulating layer on the one surface, forming a gate electrode over the insulating layer above the surface region between the source and drain of the first transistor, a gate electrode over the insulating layer above the surface region between the source and drain of the second transistor, and electrodes on the source and drain regions of both transistors.

Embodiments of the invention will now be described by way of example with reference to FIGS. 1 to 7 of the diagrammatic drawings accompanying this specification, in which:

FIG. 1 shows in cross-section part of the semiconductor body of an insulated gate field effect transistor suitable for operation in the depletion mode;

FIGS. 2 and 3 each show in cross-section part of the semi-conductor body of an insulated gate field effect transistor suitable for operation in the enhancement mode, the FIG. 2 transistor being a P-channel device and the FIG. 3 transistor being an N-channel device;

Figure 6:
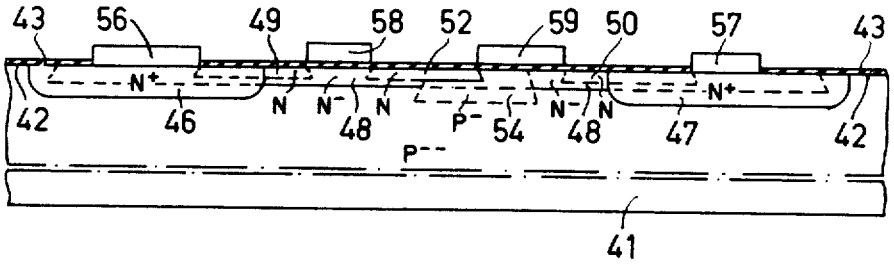
Figure 7:
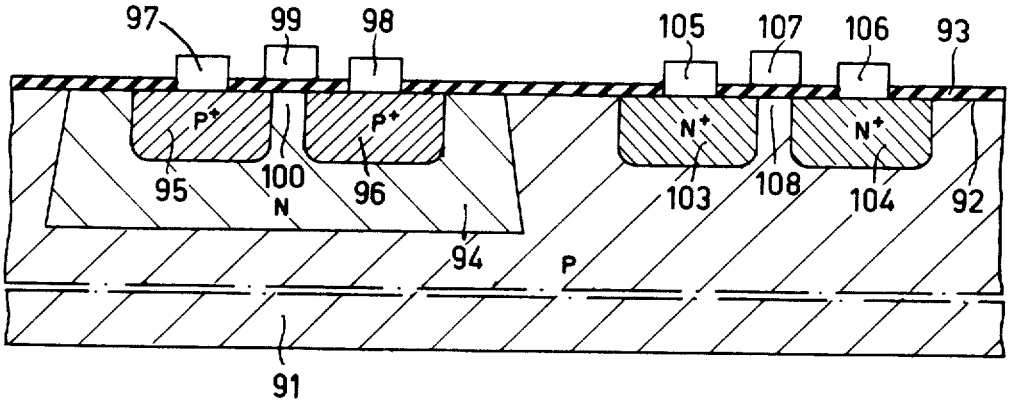

FIG. 6 shows in cross-section part of the semiconductor body of a tetrode insulated gate field effect transistor suitable for high frequency operation with high power gain; and FIG. 7 shows in cross-section part of the semiconductor body of a semiconductor integrated circuit comprising a complementary pair of insulated gate field effect transistors, both being suitable for operation in the enhancement mode.

Figure 1:
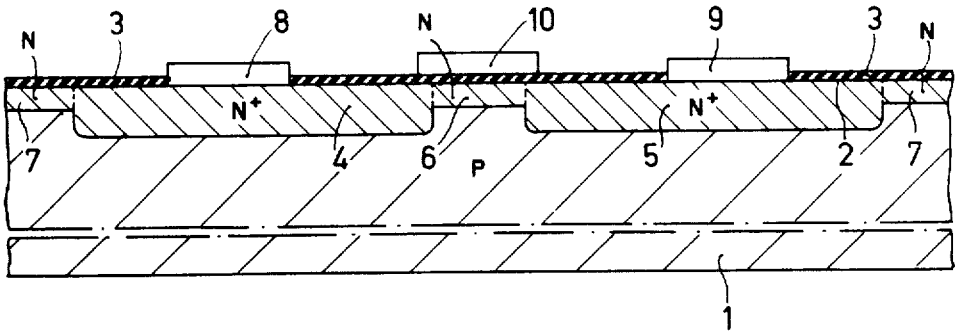

The insulated gate field effect transistor shown in FIG. 1 is an N-channel depletion mode MOST. The semiconductor body comprises a P-type substrate 1 having a resistivity of 15 ohm-cm and of 200 microns thickness. The substrate 1 has a plane surface 2 at which there is a layer 3 of silicon oxide of 0.2 micron thickness. Two low resistivity $N^+$-type regions 4 and 5 extend from the surface 2 into the P-type substrate 1. The regions 4 and 5 have been formed by diffusion of phosphorus into two surface portions of the substrate and extend into the substrate at a distance of approximately 2 microns from the surface 3. The surface concentration of phosphorus in the regions 4 and 5 is approximately $10^{21}$ atoms/cc. The width of each of the regions 4 and 5 in the section shown in FIG. 1 is approximately 15 microns and they are separated by a distance of approximately 4 microns.

Between the $N^+$-type regions 4 and 5 there is an N-type surface region 6 of 1 ohm-cm resistivity and containing a concentration of implanted phosphorus ions. This ion implanted region 6 is referred to as an N-type skin and extends into the substrate at a distance of 0.8 micron from the surface 2. An N-type surface region 7 extends across other parts of the substrate surface beyond the regions 4 and 5 and also contains a concentration of implanted phosphorus ions. Aluminum layer parts 8 and 9 of approximately 1 micron thickness and 5 microns width are situated on the surface portions of the regions 4 and 5 respectively and form electrodes thereon. A gate electrode consisting of an aluminum layer part 10 of 1 micron thickness is situated on the silicon oxide layer 2 above and slightly overlapping the N-type skin 6.

In this device, which is suitable for operation in the depletion mode, the current carrying channel is present in the N-type ion implanted skin 6. Due to the provision of said skin the effective electron mobility in the channel is significantly higher than in a prior art depletion mode device in which the channel is formed in a preformed N-type inversion layer. Due to the increase in effective electron mobility in the channel the gain factor ($\beta$) of the transistor shown in FIG. 1 is between two and three times that of a prior art device having the same channel length.

The manufacture of the MOST shown in FIG. 1 will now be described. The starting material is a large slice of P-type silicon of 15 ohm-cm resistivity and 200 microns thickness in which, during subsequent processing steps, a plurality of MOST structures are formed at a corresponding plurality of sites on the slice, However, the manufacture will be described with reference to the formation of one such MOST structure, it being understood that where operations such as diffusion, ion implantation, photomasking and etching are referred to, each of these operations is carried out at a plurality of locations on the slice.

The slice is prepared with the crystallographic orientation of its major surfaces parallel to the <111> planes. One major surface 2 is prepared to be optically flat. An insulating layer 3 of silicon oxide of 0.5 micron thickness is grown on the surface by exposure in wet oxygen at an elevated temperature. Two openings are formed in the silicon oxide layer by the normal photomasking and etching technique, said openings exposing two surface portions of the substrate. A phosphorus diffusion step is carried out to form the $N^+$-type regions 4 and 5 by diffusion in the parts of the substrate exposed by said two openings. Subsequently the silicon oxide layer 3 together with any glass layer formed on the surface in the openings during the phosphorus diffusion step is now removed completely from the surface 2.

The silicon body is placed in the target chamber of an ion implantation apparatus. The implantation of phosphorus ions is effected into the surface 2. The implantation energy is 40 KeV, the dose is of the order of $10^{11}$ atoms/sq.cm and the orientation of the body is such that the direction of the ion beam is within ±2° of the <111> direction.

After removal from the ion implantation apparatus a fresh layer 3 of silicon oxide of 0.2 micron thickness is grown rapidly on the surface 2 by oxidation of the silicon in wet oxygen at an elevated temperature. This oxidation treatment also serves as a post implantation annealing process in which a certain redistribution of the implanted phosphorus ions occurs. Openings are formed in the insulating layer above the $N^+$-type regions 4 and 5, said openings each having a dimension of approximately 5 microns in the section shown in FIG. 1. An aluminum layer of approximately 1 micron thickness is deposited over the entire surface of the silicon oxide layer 3 and in the openings therein. Thereafter by a photomasking and etching step the electrodes 8, 9 and 10 are defined by selective removal of parts of the aluminum layer. The gate electrode 10 has a dimension of approximately 5 microns in the section shown in FIG. 1.

Connection of wires to the electrodes 8, 9 and 10 is carried out and connection to the substrate 1 made in a conventional manner as commonly carried out in semiconductor manufacture. Finally the device is suitably encapsulated.

Figure 2:
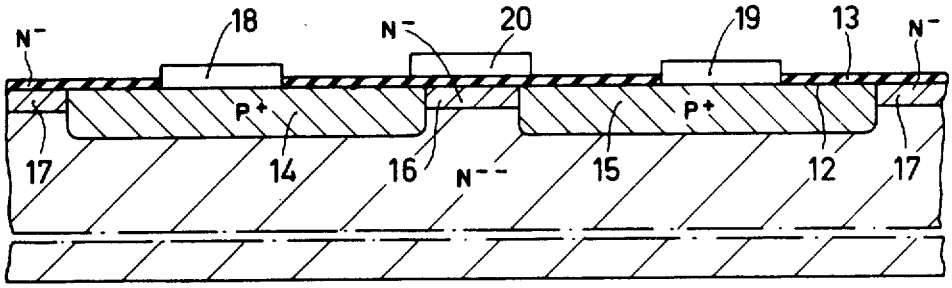

The insulated gate field effect transistor shown in FIG. 2 is a P-channel enhancement mode MOST. The semiconductor body comprises a high resistivity N-type substrate 11 having a resistivity of 15 ohm-cm and of 200 microns thickness. The substrate 11 has a plane surface 12 at which there is a layer 13 of silicon oxide of 0.2 micron thickness. Two low resistivity $P^+$-type regions 14 and 15 extend from the surface 12 into the N-type substrate 11. The regions 14 and 15 have been formed by diffusion of boron into two surface portions of the substrate and extend into the substrate at a distance of 2 microns from the surface 13. The surface concentration of boron in the regions 14 and 15 is approximately $5 \times 10^{20}$ atoms/cc. The width of each of the regions 14 and 15 in the section shown in FIG. 2 is approximately 15 microns and they are separated by a distance of approximately 4 microns.

Between the $P^+$-type regions 14 and 15 there is an $N^-$-type surface region 16 of 1 ohm-cm resistivity and containing a concentration of implanted phosphorus ions. The ion implanted region 16 is referred to as an $N^-$-type skin and extends into the substrate at a distance of 0.8 micron from the surface 12. An $N^-$-type surface region 17 extends across the remainder of the substrate surface beyond the regions 14 and 15 and also contains a concentration of implanted phosphorus ions. Aluminum layer parts 18 and 19 of approximately 1 micron thickness are situated on the surface portions of the regions 14 and 15 respectively and form electrodes thereon. A gate electrode 20 consisting of an aluminum layer part of 1 micron thickness is situated on the silicon oxide layer 12 above and slightly overlapping the $N^-$-type skin 16.

In this device which is suitable for operation in the enhancement mode, the current carrying channel is formed by inversion of at least part of the $N^-$-type ion implanted skin 16. Due to the provision of said skin the threshold voltage of the device is determined reproduceably within fairly fine limits.

The manufacture of the MOST shown in FIG. 2 corresponds substantially to the manufacture of the MOST shown in FIG. 1, the main difference being that in the manufacture of the P-channel device of FIG. 2 the initial diffusion is of boron.

Figure 3:
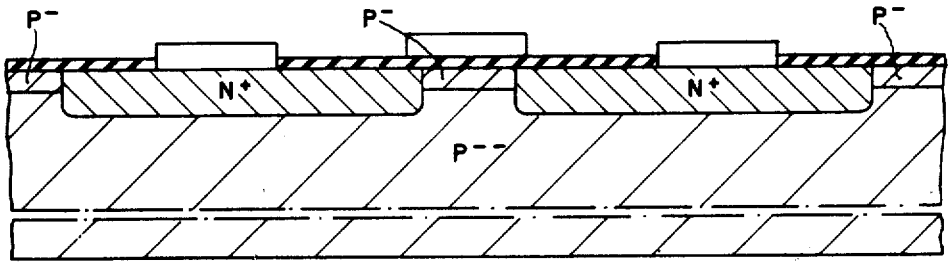

The insulated gate field effect transistor shown in FIG. 3 is an N-channel enhancement mode MOST. In this device the dimensions of the semiconductor body and the various regions and electrodes correspond substantially to those of the P-channel MOST shown in FIG. 2. The difference resides in that the substrate of the FIG. 3 device is of $P^{--}$-type, the ion implanted surface skin is of $P^-$-type and the source and drain regions are $N^+$-type. This configuration is particularly favorable for an N-channel enhancement mode MOST since the provision of the $P^-$-type ion implanted skin enables good control of the threshold voltage to be obtained. Furthermore the resistivity of the $P^{--}$-type substate may be chosen to be fairly high, for example 15 ohm-cm. It will be appreciated that the direct formation of an N-channel enhancement mode MOST in such material would not be readily possible since oxidation of the surface of such high resistivity material forms an N-type inversion layer. Further advantages of providing an ion implanted $P^-$-type skin in a $P^{--}$-type part for an N-channel enhancement mode MOST, including the possibility of having short channel lengths due to the $P^-$-type region inhibiting punch-through to the source of the drain to substrate depletion layer, will be described with reference to the following embodiment shown in FIG. 4. The manufacturing steps in forming the device shown in FIG. 3 are similar to those described with reference to FIG. 1, the main difference residing in that the ion implantation of the skin is carried out using boron ions. Suitable conditions for the boron implantation are at an energy of 20 KeV with a dose of approximately $5 \times 10^{11}$ atoms/sq.cm.

Figure 4:
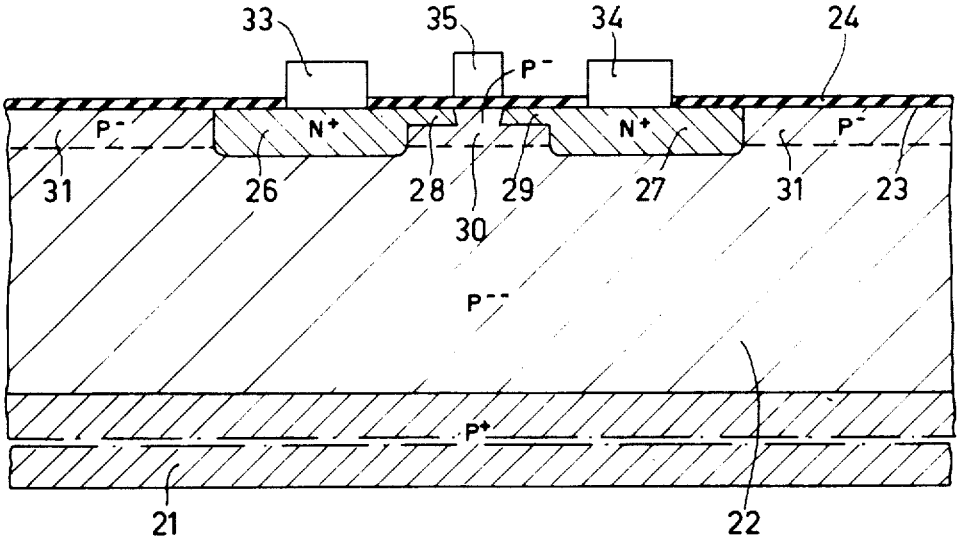
FIG. 4 shows in cross-section part of the semiconductor body of an insulated gate field effect transistor suitable for high frequency operation in the enhancement mode.

The insulated gate field effect transistor shown in FIG. 4 is an N-channel enhancement mode MOST suitable for high frequency operation. The semiconductor body comprises a low resistivity $P^+$-type substrate 21 having a resistivity of 0.05 Ohm-cm and of 200 microns thickness, and a high resistivity epitaxial $P^{--}$-type layer 22 of 15 ohm-cm resistivity and 6 microns thickness situated on the substrate 21. The layer 22 has a plane surface 23 at which there is a layer of silicon oxide 24 of 0.12 micron thickness. Two low resistivity $N^+$-type regions extend from the surface 23 into the $P^{--}$-type layer 22. The $N^+$-type regions comprise diffused portions 26 and 27 respectively formed by diffusion of phosphorus into two surface portions of the layer 22 and ion implanted portions 28 and 29 respectively adjoining the portions 26 and 27, the portions 28 and 29 having been formed by implantation of phosphorus ions into the surface through the silicon oxide layer 23 in accordance with the method described in said copending application, Ser. No. 753,449 and now U.S. Pat. No. 3,596,347. The diffused portions 26 and 27 extend into the layer 22 at a distance of approximately 1 micron from the surface 23 and the ion implanted portions 28 and 29 extend into the layer at a distance of 0.3 micron from the surface 23. The sheet resistance of the diffused portions 26 and 27 is approximately 20 ohms per square and in the ion implanted portions 28 and 29 is 300 ohms per square. The width of each of the diffused portions 26 and 27 in the section shown in FIG. 4 is approximately 15 microns and the width of each of the ion implanted portions 28 and 29 is approximately 3 microns. The ion implanted portion 28 and 29 are separated by a distance of approximately 3 microns. The portions 28 and 29 lie within a P-type surface region 30 of 0.75 ohm-cm resistivity and containing a concentration of implanted boron ions. The ion implanted region 30 is referred to as a $P^-$-type skin and extends into the higher resistivity $P^{--}$-type layer 22 at a distance of 0.7 micron from the surface 23. A P-type surface region 31 extends across the remainder of the layer surface beyond the regions 26, 28 and 27, 29 and also contains a concentration of implanted boron ions. Electrodes consisting of aluminum layer parts 33 and 34 of approximately 1 micron thickness and 5 microns width in the section shown are situated on the surface portions of the regions 26, 28 and 27, 29 respectively, said surface portions being located in openings in the silicon oxide layer 24. A gate electrode consisting of an aluminum layer part 35 of 1 micron thickness and 3 microns width is situated on the silicon oxide layer 24 directly above the $P^-$-type ion implanted surface region 30 between the $N^+$-type ion implanted portions 28 and 29.

In this device, which is suitable for high frequency operation in the enhancement mode, the current carrying channel is formed by inversion of at least the part of the $P^-$-type ion implanted skin 30 located adjacent the surface 23 between the $N^+$-type ion implanted regions 28 and 29. Due to the provision of the ion implanted skin 30 the threshold voltage of the device is determined reproduceably within fairly fine limits. The device has a relatively high power gain since the effective channel length is small, that is 3 microns, due to the described configuration being obtained by the method of Auto-Registration. This method also gives a low value of the gate to drain capacitance and gate to source capacitance since the overlap of the gate electrode 35 above the $N^+$-type ion implanted regions 28 and 29 is determined only by the sideways scattering and channelling of the phosphorus ions, this overlap being only 0.25 micron or less on each side. The capacitance between drain and substrate is also small, a measured value at $V_{Drain\text{-}Substrate}$ of 20 volts being $2 \times 10^3$ pF/cm$^2$. This is because at such a voltage between the drain and substrate the depletion layer associated with the junction between the $N^+$-type drain 27, 29 and the $P^{--}$-type region 22 approaches the $P^+$-type substrate 21. The presence of the $P^-$-type skin 30 also limits the spreading of this depletion layer in the region of the device adjacent the channel and thus punch-through of this depletion layer to the source at such a voltage is prevented. This facilitates the provision of the small source to drain separation, viz. 3 microns.

The manufacture of the high frequency triode MOST shown in FIG. 4 will now be outlined in terms of the main steps in their relative order of succession. A $P^+$-type silicon slice of 200 microns thickness and 0.05 ohm-cm resistivity is prepared with one of its major surfaces having an optically flat finish. The orientation is with the major surface parallel to the <111> planes. An epitaxial layer of $P^{--}$-type silicon of 15 ohm-cm resistivity is grown on the prepared major surface. The surface of the layer is suitably prepared to be optically flat. A silicon oxide layer of 0.2 $\mu$ thickness is grown on the surface of the epitaxial layer by exposure in wet oxygen at 1,100° C. for 15 minutes. Openings are formed in the silicon oxide layer by the normal photomasking and etching techniques. Phosphorus is then diffused into the exposed surface portions to form the $N^+$-type regions 26 and 27. Subsequently the silicon oxide layer is removed from the surface and a fresh insulating layer 24 of silicon oxide of 0.12 microns thickness is grown on the surface 23 by exposure in wet oxygen at 1,100° C. for approximately 6 minutes. The heating in wet oxygen may be followed by an etching step to determine accurately the thickness of the oxide layer 24. Implantation of boron ions is then effected into the whole surface through the silicon oxide layer 24. The orientation of the body is with the surface normal to the ion beam. The energy is 140 KeV and the dose $2.5 \times 10^{12}$ atoms/sq.cm. This is followed by an annealing step at 700° C. for 30 minutes. The implantation and annealing steps yield the $P^-$-type skin 30, 31. Contact windows for the source and drain are then formed in the layer 24, said windows exposing the $N^+$-type regions 26 and 27. An aluminum layer of 1.0 micron thickness is then deposited over the whole surface of the insulating layer and in the openings formed therein. A photomasking and etching step is carried out to define the gate electrode 35 and parts of the source and drain electrodes 33, 34. A phosphorus ion implantation Auto-Registration step is then carried out to form the ion implanted portions 28 and 29. The energy is 100 KeV and the dose $6 \times 10^{15}$ atoms/sq.cm. with the surface normal to the ion beam axis. A post-implantation annealing step is then carried out at 500° C. for 30 minutes. Finally the external portions of the source and drain electrodes are defined by a photomasking and etching step, the body is mounted, connecting wires are provides and the unit is encapsulated.

Figure 5:
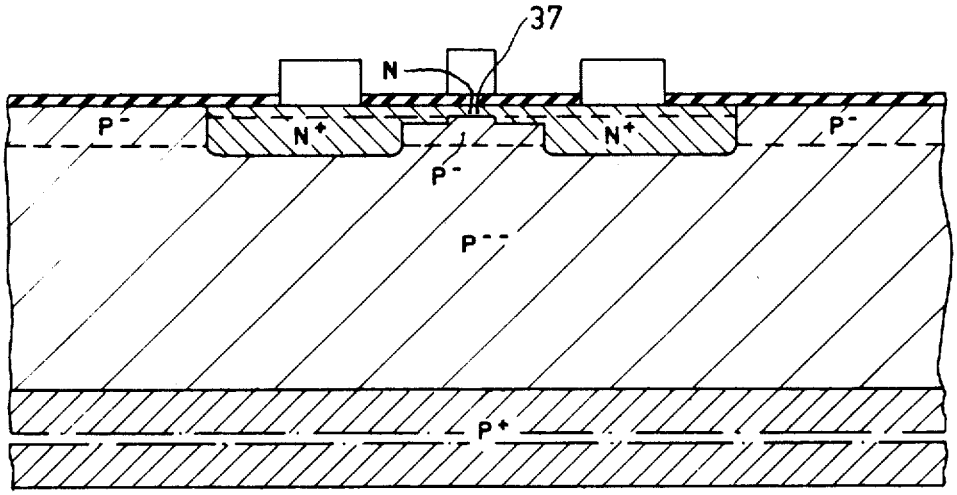
FIG. 5 shows in cross-section part of the semiconductor body of an insulated gate field effect transistor suitable for high frequency operation in the depletion mode.

The insulated gate field effect transistor shown in FIG. 5 is an N-channel depletion mode MOST suitable for high frequency operation. In construction it is basically similar to the N-channel enhancement mode MOST shown in FIG. 4, the main difference being that it additionally comprises an ion implanted N-type skin 37 of approximately 0.1 micron thickness and 0.1 ohm-cm resistivity. The current carrying channel is present within the skin 37. The N-type skin 37 lies within a $P^-$-type skin of approximately 0.7 micron thickness and of 0.75 ohm-cm resistivity. This device has a high carrier mobility and gain factor due to the presence of the ion implanted N-type skin 37 and also has similar advantages to those described for the FIG. 4 enhancement mode device in respect of the channel length, drain to substrate capacitance, gate to drain capacitance and prevention of punch-through to the source of the depletion layer associated with the drain junction. The steps in the manufacture of this device are similar to those involved in the manufacture of the FIG. 4 device, the main difference residing in the additional phosphorus ion implantation step required to produce the N-type skin 37.

The insulated gate field effect transistor shown in FIG. 6 is a tetrode MOST comprising a first transistor portion suitable for operation in the depletion mode, the N-type current carrying channel therein being present in an ion implanted 'skin', and a second transistor portion suitable for operation either in the enhancement or depletion mode according to the applied voltage on the gate electrode associated therewith, the N-type current carrying channel in the second transistor portion being present partly in a N-type ion implanted skin and partly within an N-type inversion layer in an ion implanted $P^-$-type region.

The semiconductor body comprises a high resistivity $P^{--}$-type substrate 41 of approximately 10 ohm-cm resistivity of 200 microns thickness. The substrate 41 has a plane surface 42 on which a silicon oxide layer 43 of 0.1 micron thickness is present. A low resistivity $N^+$-type diffused region 46 extends into the substrate at a maximum distance therefrom of 1.5 microns and forms the major part of a source region. A low resistivity $N^+$-type diffused region 47 extends into the substrate 41 from the surface 42 at a maximum distance therefrom of 1.5 microns and forms the major part of a drain region.

An $N^-$-type ion implanted skin 48 is present extending into the body at a distance therefrom of 0.75 micron and containing a concentration of implanted phosphorus ions yielding a resistivity of approximately 1.0 ohm-cm.

The source and drain regions respectively also comprises ion implanted N-type portions 49 and 50 which extend in the body at a distance from the surface 42 of 0.5 micron and contain a concentration of implanted phosphorus ions yielding a resistivity of approximately $10^{-3}$ ohm-cm.

Between the source region 46, 49 and the drain region 47, 50 there is an N-type ion implanted region 52 which also extends in the body from the surface 42 at a maximum distance therefrom of 0.5 micron and contains a concentration of implanted phosphorus ions yielding a resistivity of approximately $10^{-3}$ ohm-cm.

The device may be considered as a first insulated gate field effect transistor part between the source 46, 49 and the region 52, and a second insulated gate field effect transistor part between the region 52 and the drain 47, 50. The region 52 is referred to as the virtual source and drain.

Between the virtual source and drain 52 and the drain 47, 50 there is an ion implanted $P^-$-type region 54 which extends in the body at a maximum distance from the surface 42 of 1.5 microns. The $P^-$-type region 54 extends around the edges of the virtual source and drain 52 which face the drain 47, 50 and contains a concentration of implanted boron ions. The resistivity of the $P^-$-type region 54 is approximately 1 ohm-cm, allowance having been made during its formation for the phosphorus concentration of the $N^-$-type skin 48 which is present within the part of the region 54 adjacent the surface 42.

On the surface 42 in openings in the insulating layer 43 there are source and drain electrodes 56 and 57 respectively, each consisting of an aluminum layer of 1.0 micron thickness. On the part of the insulating layer 43 above the surface portion of the body between the source region portion 49 and the virtual source and drain region 52 there is a first gate electrode 58 consisting of an aluminum layer of 1.0 micron thickness. On the part of the insulating layer 43 above the surface portion of the body between the virtual source and drain 52 and the drain region portion 50 there is a second gate electrode 59 consisting of an aluminum layer of 1.0 micron thickness.

A first insulated gate field effect transistor part is formed by the source 46, 49, the virtual drain 52, and the gate 58. The current carrying channel is present in the $N^-$-type skin situated below the gate electrode 58 and between the $N^-$-type regions 49 and 52. The channel length corresponds substantially to the lateral dimension of the gate electrode 58 because the regions 49 and 52 have been formed by the techniques of Auto-Registration in accordance with the method described in the said copending application, Ser. No. 753,449. The channel length is approximately 2.5 microns.

A second insulated gate field effect transistor part is formed by the virtual source 52, the drain 47, 50, and the gate 59. The current carrying channel in this transistor part lies below the gate electrode 59 partly within an N-type surface inversion layer formed at the surface of the $P^-$-type region 54 and partly within the $N^-$-type skin 48. The channel length of the second transistor part is approximately 3.5 microns and corresponds substantially to the lateral dimension of the gate electrode 59 since the regions 52 and 50 also have been formed by the technique of Auto-Registration.

The first transistor part constitutes a high frequency, high gain depletion mode device having a small channel length and very low gate to drain capacitance. In the second transistor part which may be operated in the enhancement or depletion mode, the presence of the $P^-$-type region 54 serves to inhibit punch-through, in the depletion layer around the drain 47/substrate 41 junction, between the virtual source 52 and the drain 47, 50 at high applied voltages between the drain 47, 50 and the substrate 41. The region 54 thus also permits a small lateral separation of the virtual source 52 from the drain 47, 50, said small separataion having been achieved with the aid of the Auto-Registration technique.

In operation the source electrode 56 is connected to the substrate 41. The first gate electrode 58 is at a negative D.C. bias with respect to the source and substrate and the input signal voltage is applied to the first gate 58 over and above the D.C. bias. The second gate electrode 59 is at a D.C. bias with respect to the source and substrate which may be positive or negative as required. The gate 59 is A.C. short circuited to the source and substrate. The drain electrode 57 is at a positive bias with respect to the source and substrate, for example, 10 volts.

The steps in the manufacture of the high frequency tetrode MOST shown in FIG. 6 will now be described briefly.

1. A $p^{--}$-type silicon slice of 10 ohm-cm resistivity in which the major surfaces are parallel to the <111> planes, is prepared with one of the major surfaces optically flat.
2. A silicon oxide layer of 0.5 micron thickness is grown on the prepared surface by thermal oxidation at an elevated temperature in wet oxygen.
3. Openings are formed in the insulating layer by a normal photomasking and etching step.
4. Phosphorus is diffused into the surface portions exposed by the openings in the insulating layer to form the source region part 46 and the drain region part 47.
5. The silicon oxide layer is removed together with any phosphorus glass formed during step (4).
6. A layer of aluminum of 1.0 micron thickness is deposited over the entire surface.
7. An opening is formed in the aluminum layer by a photomasking and etching step.
8. The $p^-$-type region is formed by implantation of boron ions at 140 KeV into the surface portion exposed by the opening provided in step (7). The remaining part of the aluminum layer acts as a mask during the implantation. Subsequently an annealing step is performed.

9. A larger opening is formed in the aluminum masking layer, said opening extending approximately to the outer perimeters of the regions 46 and 47. Phosphorus ions are implanted in the exposed surface portion at 40 KeV to form the $N^-$-type skin region 48. This is followed by an annealing treatment.
10. The remaining part of the aluminum masking layer is removed.
11. A silicon oxide layer of 0.1 micron thickness is grown on the surface by thermal oxidation in wet oxygen at an elevated temperature.
12. Openings are formed in the last formed silicon oxide layer to expose the source region part 46 and the drain region part 47.
13. A layer of aluminum of 1.0 micron thickness is deposited on the entire surface of the oxide layer and in the openings therein.
14. A photomasking and etching step is carried out to define the gate electrodes 58 and 59 and to partially define the source and drain electrodes 56 and 57 respectively.
15. Phosphorus ions are implanted at 140 KeV into the surface through the oxide parts not covered by the aluminum by the method of Auto-Registration using the electrodes 56, 57, 58 and 59 as a mask. This yields the N-type portions 49 and 50 of the source and drain respectively and the virtual source and drain region 52. This is followed by an annealing step at a relatively low temperature.
16. The external parts of the source electrode 56 and the drain electrode 57 are defined in the aluminum layer by a further photomasking and etching step.
17. The slide is divided to yield a plurality of individual chips each comprising a tetrode MOST unit.
18. The 'unit' is mounted on a header, wires bonded to the electrodes and terminals, followed by encapsulation.

The semiconductor body part shown in FIG. 7 is part of a semiconductor integrated circuit comprising a complementary pair of enhancement most MOST's. The semiconductor body comprises a high resistivity P-type silicon substrate 91 of 1.4 ohm-cm resistivity. The substrate has a plane surface 92 on which a silicon oxide layer 93 is present. Extending from the surface 92 into the substrate there is a high resistivity N-type ion implanted island 94 having a resistivity of approximately 1 ohm-cm. The island 94 extends into the substrate 91 at a distance of approximately 2 microns from the surface 92.

The island 94 has been formed by implantation of phosphorus ions through open channels in the crystal lattice (channelling) at an implantation energy of 100 KeV and dose of $5 \times 10^{12}$ atoms/sq.cm. This is followed by a drive-in and annealing step at 1,050° C. in argon for approximately 10 minutes. This method yields a fairly uniform phosphorus distribution in the island 94. In the N-type island 94 there is a P-channel enhancement mode MOST comprising $P^+$-type source and drain regions 95 and 96, source and drain electrodes 97 and 98 and a gate electrode 99. The current carrying channel present is a P-type inversion layer formed in the surface region 100 below the insulated gate electrode 99. In the part of the P-type substrate beyond the island 94 there is a complementary, N-channel enhancement mode MOST comprising $N^+$-type source and drain regions 103 and 104, source and drain electrodes 105 and 106 and a gate electrode 107. The current carrying channel is present in an N-type inversion layer formed in the surface region 108 below the insulated gate electrode 107. It will be appreciated that in the integrated circuit the various electrodes of the P-channel and N-channel transistors will be connected according to a predetermined configuration. However this interconnection is not shown in FIG. 7 as this figure mainly serves to illustrate the underlying concept of a device according to the invention in which an insulated gate field effect transistor is formed in an ion implanted island of a specific conductivity type present in a substrate of opposite conductivity type within which a further circuit element is present. In the embodiment described the further circuit element is a complementary insulated gate field effect transistor but alternatively the element may be, for example, a bipolar transistor.

What is claimed is:

1. A method of manufacturing at least one insulated gate field effect transistor, comprising forming in a semiconductor body portion of one conductivity type adjacent a surface thereof by introducing opposite-type forming impurities therein spaced first and second low resistivity regions of the opposite conductivity type to constitute at least part of source and drain electrodes of the transistor, implanting ions of an impurity element in a third surface-*adjacent* region of the body portion extending between the first and second regions [to determine the conductivity thereof] to form at least a portion of a [current-carrying] channel *region located in the third region and whose conductivity is determined by the implanted ions and which functions to carry current* between the source and drain electrodes *when appropriate potentials are applied to the transistor*, providing a gate electrode on an insulating layer on said surface and extending over at least said portion of the channel *region*, and making electrical connections to the low resistivity source and drain electrodes, and to the gate electrode.

2. A method as set forth in claim 1 wherein the implanted ions are of the one-type conductivity and form a channel [portion] *region* of the one-type conductivity having a resistivity which is lower than that of the immediately underlying part of the said semiconductor body portion whereby said transistor is capable of operation in the enhancement mode.

3. A method as set forth in claim 2 wherein the first and second low resistivity regions are formed by diffusion prior to the ion-implantation step.

4. A method as set forth in claim 2 wherein the said semiconductor body portion of one conductivity type is provided as a layer on a substrate of the one conductivity type and of lower resistivity.

5. A method as set forth in claim 1 wherein the insulating layer comprises silicon oxide, and phosphorous ions are implanted in the silicon oxide insulating layer to stabilize same.

6. A method of manufacturing at least one insulated gate field effect tetrode transistor, comprising forming in a semiconductor body portion of one conductivity type adjacent a surface thereof by introducing opposite-type forming impurities therein spaced first, second and third low resistivity regions of the opposite conductivity type to constitute at least part of the source and drain electrodes of the transistor and defining between the first and second regions a first [current-carrying] channel *region* and between the second and third regions a second [current-carrying] channel *region*, implanting ions of an impurity element of the opposite conductivity type in the surface region of the body portion constituting at least the first channel region to determine the conductivity thereof, *said channel regions carrying current between the source and drain regions when appropriate potentials are applied to the transistor*, providing a first gate electrode on an insulating layer on said surface and extending over at least part of the first channel *region* and providing a second gate electrode on an insulating layer on said surface and extending over at least part of the second channel *region*, and making electrical connections to the first and third low resistivity regions, and to the gate electrodes.

7. A method as set forth in claim 6 wherein ions of the opposite conductivity type are implanted also in the second channel region.

8. A method as set forth in claim 7 wherein ions of the one conductivity type are implanted over only a portion of at least one of the channel regions and adjacent its source electrode.

9. A method of manufacturing a [semiconductOr] *semiconductor* device comprising at least a first insulated gate field effect transistor and at least a second [other] circuit element, comprising forming in a first part of a semiconductor body portion adjacent a surface thereof said [other] *second* circuit element, forming in a second part [of the semiconductor body portion] of one conductivity type *of the semiconductor body portion* adjacent a surface thereof by introducing opposite-type forming impurities therein spaced first and second low resistivity regions of the opposite conductivity type to constitute at least part of source and drain electrodes of the field effect transistor, implanting ions of an impurity element in a third surface-*adjacent* region of the body portion extending between the first and second regions [to determine the conductivity thereof] to form at least a portion of a [current carrying] channel *region located in the third region and whose conductivity is determined by the implanted ions and which functions to carry current* between the source and drain electrodes *when appropriate potentials are applied to the transistor*, providing a gate electrode on an insulating layer on said surface and extending over at least said portion of the channel *region*, and making electrical connections to the low resistivity source and drain electrodes, to the gate electrode, and to the [other] *second* circuit element.

10. A method as set forth in claim 9 wherein the [other] *second* circuit element [is also an] *constitutes a second* insulated gate field effect transistor having different properties than the first transistor determined by the ion implantation step.

[11. A method as set forth in claim 10 wherein the ion implantation step employs ions of said one conductivity type and establishes an island of said one conductivity type in a substrate of said opposite conductivity type and constituting said second part of the semiconductor body portion.]

12. A method as set forth in claim 10 wherein the first and second insulated gate field effect transistors comprise channels of opposite conductivity types *which are located at least partly in regions whose conductivity is* determined by ion implantation.

13. A method as set forth in claim 10 wherein the first and second insulated gate field effect transistors comprise channels of the same conductivity type but said transistors are adapted to operate in different ones of the depletion and enhancement modes.

[14. A method as claimed in claim 9 wherein the ion-implantation step comprises implanting in a region of the second semiconductor body portion of one conductivity type a concentration of ions of an impurity element characteristic of the opposite conductivity type, said implanted ion concentration determining a region of the opposite conductivity type which extends to one surface of the body portion and is surrounded within the body portion by a region of the one conductivity type, and forming the first insulated gate field effect transistor in the implanted region of the opposite conductivity type, and at least the other circuit element in another region of the one conductivity type.]

*15. A method as set forth in claim 1 wherein ions of the opposite type conductivity are implanted into the channel region to adjust the threshold voltage of the transistor.*

*16. In a method of manufacturing a semiconductor device comprising at least one insulated gate field effect device, comprising forming in a semiconductor body portion of one-type conductivity adjacent a surface thereof by introducing opposite-type forming impurities therein spaced first and second low resistivity regions of the opposite-type conductivity to constitute at least part of source and drain regions of the device, said source and drain regions defining between them a device channel region adjacent said surface, providing a gate electrode on an insulating layer on said surface and extending over said channel region, and making electrical connections to the low resistivity source and drain regions and to the gate electrode whereby when operating potentials are applied the device exhibits a threshold voltage which when applied to the gate causes current conduction in the channel region between the source and drain regions, the improvement comprising implanting ions of an impurity element in at least a portion of the channel region under such conditions that substantially all of said implanted ions are confined to the channel region and in such number that the threshold voltage is accurately and reproducibly controlled by the implanted ions.*

*17. The method of claim 16 wherein the implantation step follows provision of the source and drain regions and provision of the insulating layer.*

*18. The method of claim 16 wherein plural insulated gate field effect transistors are made in a common semiconductor body, ions being implanted into at least several of the transistor channel regions to control their threshold voltage.*

*19. The method of claim 18 wherein at least one of the transistors is of the enhancement type, and at least one is of the depletion type.*

*20. The method of claim 16 wherein prior to the ion implantation step to control the threshold voltage, ions are implanted into the surface of the body to form a surface region of one type conductivity that is of lower resistivity than that of underlying one type body portions.*

*21. The method of claim 16 wherein the body is of P-type material, the channel is N-type, and acceptor ions are implanted in the channel region to accurately determine the threshold voltage.*

*22. In a method of manufacturing a semiconductor device comprising at least one insulated gate field effect transistor, comprising forming in a semiconductor body portion of one-type conductivity adjacent a surface thereof by introducing opposite-type forming impurities therein spaced first and second low resistivity regions of the opposite-type conductivity to constitute at least part*

*of source and drain regions of the transistor, said source and drain regions defining between them a transistor channel region adjacent said surface, providing a gate electrode on an insulating layer on said surface and extending over said channel region, and making electrical connections to the low resistivity source and drain regions and to the gate electrode whereby when operating potentials are applied to the transistor current conduction occurs in the channel region between the source and drain regions, the improvement comprising implanting ions of an impurity element in at least a portion of the channel region in such number as to determine the doping concentration of said channel portion.*

*23. The method of claim 22 wherein one-type forming impurity ions are implanted into the whole surface of the body portion including parts extending outside the source and drain regions, and opposite-type forming impurity ions are implanted into the channel region.*

* * * * *

UNITED STATES PATENT AND TRADEMARK OFFICE

CERTIFICATE OF CORRECTION

PATENT NO. : RE 28704

DATED : February 3, 1976

INVENTOR(S) : DAVID PHYTHIAN ROBINSON ET AL

It is certified that error appears in the above-identified patent and that said Letters Patent are hereby corrected as shown below:

Column 6, line 26, change "MOSE" to -- MOST --.

Column 11, line 46, change "semi-conductor" to -- semiconductor --.

Column 14, line 21, change "$P^{\equiv}$ - type" to -- $P^{-\equiv}$ -type --.

Signed and Sealed this

*twenty-seventh* Day of *April 1976*

[SEAL]

*Attest:*

RUTH C. MASON
*Attesting Officer*

C. MARSHALL DANN
*Commissioner of Patents and Trademarks*